US005764047A

United States Patent [19]

Massie

[11] Patent Number: 5,764,047
[45] Date of Patent: Jun. 9, 1998

[54] MEASUREMENT OF POWER SUPPLY DC CURRENT BY MEANS OF A SMALL AC CURRENT

[75] Inventor: Harold L. Massie, West Linn, Oreg.

[73] Assignee: Intel Corporation, Santa Clara, Calif.

[21] Appl. No.: 891,414

[22] Filed: Jul. 9, 1997

Related U.S. Application Data

[63] Continuation of Ser. No. 580,854, Dec. 29, 1995, abandoned.

[51] Int. Cl.$^6$ ........................................... G01R 33/00
[52] U.S. Cl. ................................. 324/117 R; 324/771
[58] Field of Search ........................ 324/117 R, 126, 324/73.1, 127, 158.1, 244, 426, 250, 253, 771; 336/212, 215; 323/356, 357

[56] References Cited

U.S. PATENT DOCUMENTS

| | | | |
|---|---|---|---|
| 3,383,589 | 5/1968 | Dugan, Jr. | 324/618 |
| 3,422,352 | 1/1969 | Paulkovich | 324/117 R |
| 3,500,171 | 3/1970 | Kusters et al. | 324/117 R |
| 4,037,156 | 7/1977 | Goujon et al. | 324/771 |
| 5,008,612 | 4/1991 | Otto | 324/117 R |
| 5,053,695 | 10/1991 | Canter | 324/126 |

*Primary Examiner*—Vinh P. Nguyen
*Attorney, Agent, or Firm*—Blakely, Sokoloff, Taylor & Zafman

[57] ABSTRACT

An apparatus for measuring the dc current in a power supply circuit includes a transformer having a primary winding, a core and a secondary winding, a current generator, a pulse generator, and a measurement circuit. The secondary winding of the transformer is coupled to the power supply circuit, wherein the power supply circuit supplies dc current to the secondary winding generating a second field of magnetic flux. The current generator, coupled to the primary winding of the transformer, supplies an ac current to the primary winding generating a first field of magnetic flux. The pulse generator, coupled to the primary winding, generates a pulse when the first field of magnetic flux is substantially equal to the second field of magnetic flux. The measuring circuit, coupled to the current generator and responsive to the pulse generator, measures the ac current from the current generator in response to a pulse received from the pulse generator, wherein the ac current is proportional to the dc current.

20 Claims, 3 Drawing Sheets

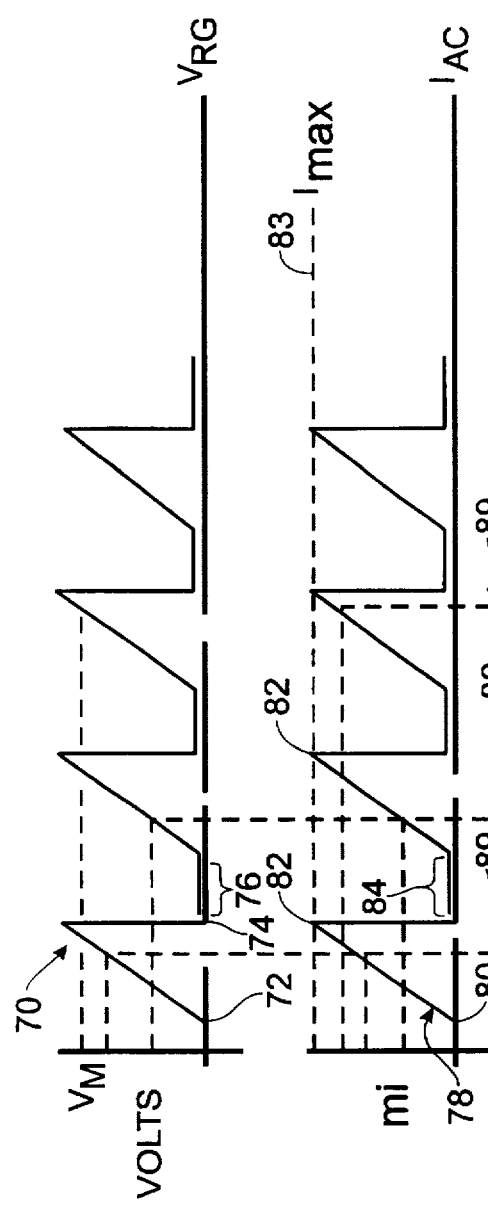
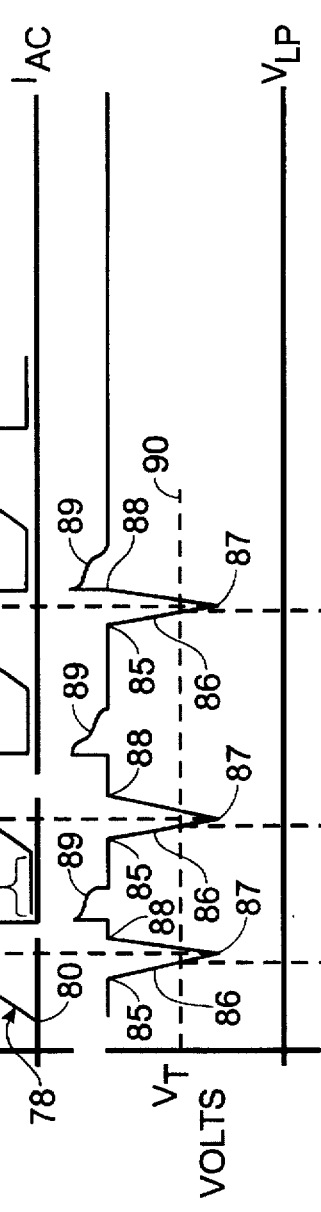
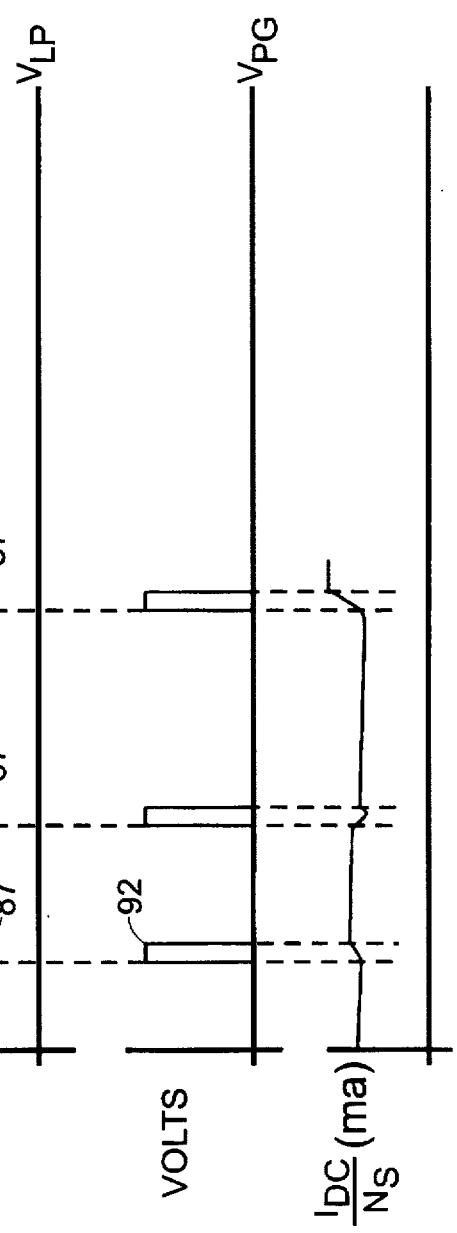

MEASUREMENT OF POWER SUPPLY DC CURRENT BY MEANS OF A SMALL AC CURRENT

This is a continuation of application Ser. No. 08/580,854, filed Dec. 29, 1995, now abandoned.

BACKGROUND OF THE INVENTION

1. Field of the Invention

The present invention relates to low cost circuits for accurately measuring large dc currents. More particularly, it relates to the use of a small ac current on one winding of a transformer while the much larger dc current passes through the other winding of the transformer.

2. Description of the Prior Art

Personal computer systems typically utilize a single dc power supply capable of supplying up to 300 watts. To do this, the power supply accepts utility-provided power at 110 volts nominal and puts out varying amounts of direct current ("dc") at several relatively low voltages—typically 5 volts and 12 volts. In modern high performance personal computer systems, it is desirable to have two inexpensive system power supplies. When both power supplies are working, they would share the power load and thus last longer. If one should fail, the second provides redundancy. However, to achieve such a system, it is necessary to manage the power output of each power supply. And in order to manage the power supplies, it is necessary to measure the current output of each power supply. However, it is desirable to minimize the amount of power used to make the current measurement. Thus, for example, the typical technique of measuring the voltage drop across a resistor not only wastes power, but since the power supplies are inexpensive, commercially available models, they have a fixed output and dissipating power internally to make measurements may cause the power supplies to go out of regulation.

SUMMARY OF THE INVENTION

The present invention is a system for measuring dc current in a circuit with a small ac current. The system includes means connected to the circuit for generating a first field of magnetic flux proportional to the dc current. The system also includes means for generating a second field of magnetic flux proportional to an ac current. There are means for detecting when the fluxes are equal that are connected to the means for generating the first and the second fields of magnetic flux. And there is a means connected to the detection means and to the means for generating the second field of magnetic flux proportional to an ac current. This means measures the value of the ac current when the first and second magnetic fluxes are equal.

BRIEF DESCRIPTION OF THE DRAWING

The preferred embodiment will now be described in conjunction with the drawing wherein:

FIG. 2 (a) is a graph of the wave form of the output of ramp generator of FIG. 1.

FIG. 2 (b) is a graph of the wave form of the output of the current generator of FIG. 1.

FIG. 2 (c) is a graph of the wave form of the voltage developed across the transformer primary winding of FIG. 1.

FIG. 2 (d) is a graph of the wave form of the output of the pulse generator of FIG. 1.

FIG. 2 (e) is a graph of the wave form of the output of the system which is the measured output.

DESCRIPTION OF THE PREFERRED EMBODIMENT

Figure 1:
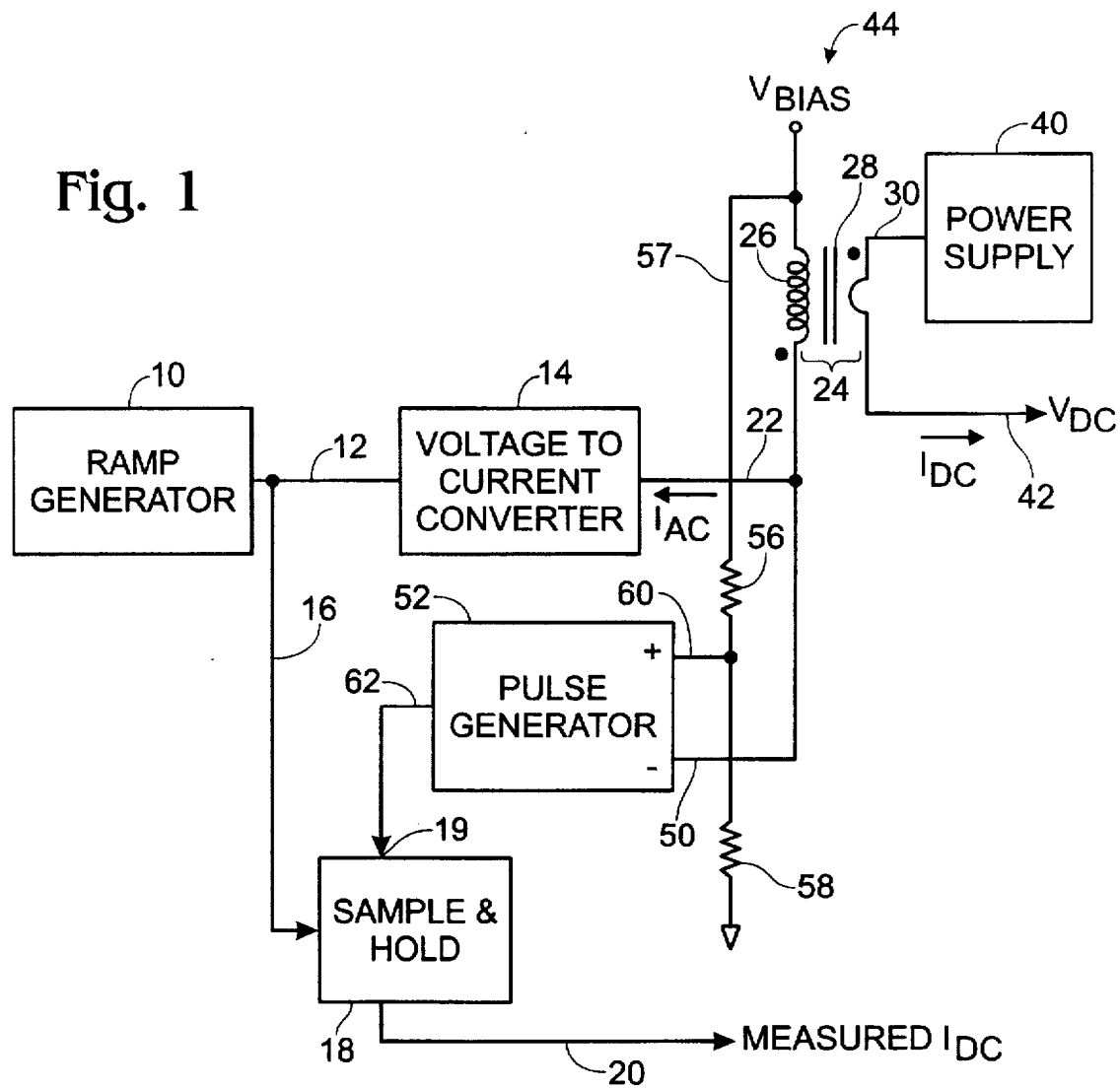
FIG. 1 is a block diagram of a preferred embodiment of the system according to the present invention.

FIG. 1 is a block diagram of one example embodiment of the system incorporating the teachings of the present invention. FIGS. 2 (a)–(d) are a set of graphs that show the signal waveform at particular points in the block diagram of FIG. 1. The horizontal axis is time. The vertical axis is voltage or current as marked. Referring now to FIGS. 1 and 2, a ramp generator has its output connected via lead 12 to the input to voltage to current converter 14. Ramp generator 10 also has its output connected via lead 16 to a sample signal input of sample and hold circuit 18. Sample and hold circuit 18 also has a timing signal input 19 and an output 20 on which the measured value of the DC current appears.

The output of voltage to current converter 14 is connected via lead 22 to a primary winding 26 of transformer 24. Transformer 24 also has a core 28 and a secondary winding 30. Primary winding 26 has turns, $N_P$ and secondary winding 30 has turns, $N_S$. A power supply 40 has its output connected to one side of secondary winding 30 of transformer 24. The other side of secondary winding 30 is output 42 of power supply 40. Power supply 40 supplies a large dc output current, $I_{DC}$.

Core 28 has a high permeability to allow saturation at low currents. With a high permeability and high number of turns, Ns, the core will saturate at a very small percentage of the maximum $I_{DC}$, about three percent. The low saturation current allows high resolution of the current measurement as well as measurement of low $I_{DC}$ current.

One side of primary winding 26 is connected to a bias voltage 44, $V_b$, which is preferably 5 volts for low power loss in the voltage to current converter 14. The other side of primary winding 26 is connected to the negative input 50 of pulse generator 52. $V_b$ 44 is also connected via lead 54 through voltage dividing resistors 56 and 58 to ground. The midpoint between resistors 56 and 58 is connected to positive input 60 of pulse generator 52. The value of resistors 56 and 58 set a voltage threshold, $V_T$, on pulse generator 52. Output 62 of pulse generator 52 is connected to timing signal input 19 of sample and hold circuit 18.

FIG. 2(a) shows the voltage wave form of the output, $V_{RG}$, of ramp generator 10. Referring now to FIG. 2(a), the wave form is a conventional ramp shown generally at reference numeral 70 rising from 0 at time 72 to a peak voltage at time 74. Voltage ramp 70 also has a dead time shown by the time period 76. In one embodiment, the rise time of the periodic ramp signal is approximately 4 milliseconds, and the dead time is approximately 6 milliseconds. The timing arrangement in this example embodiment allows the flux in core 28 to reset to its initial state during the dead time 76.

Voltage to current converter 14 converts the voltage on its input to a proportional current at a constant voltage with no change in phase between the input and output. FIG. 2(b) shows the wave form of the output of current generator 14 which is labeled $I_{AC}$. Referring now to FIG. 2(b), current wave form $I_{AC}$ 78 follows $V_{RG}$ from 0 at time 80 to a peak value at time 82 and has dead time 84. Since power is the product of voltage multiplied by current, increasing dead time 84 will reduce the average current and therefore reduce the average power loss. A very long dead time minimizes power, however long dead times also reduce the sampling rate of the current measurements. In a preferred embodiment, the dead time is set such that 100 samples are taken each second.

When power supply 40 is on, a large dc current, $I_{DC}$, passes through secondary winding 30 of transformer 24. Core 28 of transformer 24 is chosen to have a high permeability so that transformer 24 is saturated with only 3% of $I_{DC}$ flowing through the secondary winding 30. When transformer 24 is saturated, the self inductance of primary winding 26, $L_P$ and of secondary winding 30, $L_S$ are substantially zero. Thus, there is no voltage drop across windings 26 and 30.

Primary winding 26 is wound relative to secondary winding 30 such that when current flows from bias voltage source 44, $V_b$, through primary winding 26, the flux in core 29 caused by the current $I_{DC}$ is opposed. The flux, Φ, in core 29 is set out in Equation 1 following:

$$\Phi = K(N_S I_{DC} - N_P I_{AC}). \tag{1}$$

where K is a constant

Referring again to FIG. 2(b), as the current ramps up from zero at time 80, the flux in core 28 is decreased. For so long as core 28 stays in saturation, the two inductances $L_P$ and $L_S$ remain substantially zero. Thus no voltage drops across windings 26 and 30. As the value of $N_S I_{DC}$ approaches the value of $N_P I_{AC}$, the flux in core 28 is reduced to the point that core 28 comes out of saturation. When this happens, a negative voltage is generated across primary winding 26 according to Equation 2 following $$V_{LP} = L_P dI/dt \tag{2}$$

where I is the net current flowing in winding 26.

Referring now to FIG. 2c, negative voltage spike 86 commences at time 85 and reaches a peak value at time 87 when $N_S I_{DC} = N_P I_{AC}$ and the flux in core 26 is zero. Then, as core 28 goes back into saturation, now due to the continued increase in $N_P I_{AC}$, negative voltage spike 86 drops rapidly to zero again at time 88.

In FIG. 2(b), when ac current 78 reaches its peak at time 82, it rapidly drops to zero. This change in current, which is in a direction opposite to the increase taking place from times 80 to 82, causes a positive voltage spike 89 in FIG. 2(c).

Voltage spike 86 can occur at any time between times 80 and 82 since the amount of flux to be overcome by NpIaC depends on NsIdc. $I_{DC}$ can vary from zero to a value $I_{MAX}$ which is the maximum dc current at which power supply 40 is rated. In FIG. 2(b), $N_S I_{MAX}$ is indicated by dotted line 83. In order to be able to measure all values of $I_{DC}$ from zero to $I_{MAX}$, it is necessary that the peak value of $I_{AC}$ which occurs at time 82 be greater than $N_S I_{MAX}$.

At voltage level 90, the voltage on input terminal 50 of pulse generator 52 reaches a threshold value, $V_T$. As the voltage applied to negative input 50 of pulse generator 52 drops below the threshold voltage on positive terminal 60 (e.g. set by resistors 56, 58 and $V_B$) a positive pulse is generated on output 62 and supplied to timing signal input 19 of sample and hold circuit 18. The output of pulse generator 52 is shown by the wave form of FIG. 2(d). When output pulse 92 of pulse generator 52 is imposed on applied to input 19 of sample and hold circuit 18, a sample of the voltage 70 on ramp generator 10 is taken and supplied to output 20. This voltage is proportional to current $I_{AC}$ at the same point in time which is in turn equal to $I_{DC}/N_P$.

FIG. 2(d) shows the signal on output 20. The y-axis is $I_{DC}/N_P$ in milliamperes.

Dead time 84 is used to allow the flux in core 28 to return to saturation and to reduce the power loss in the voltage to current converter.

The relative number of turns on primary winding 26, $N_P$ and secondary winding 30, $N_S$ is important for determining the size of ac current required to measure a given dc current. The greater the ratio of $N_S$: $N_P$, the larger the dc current may be that can be measured with a given amplitude ac current. Preferably, the ratio of $N_S$: $N_P$ is at least a factor of 10. In one preferred embodiment, $N_S$ is 100 and $N_P$ is 1.

Figure 3:
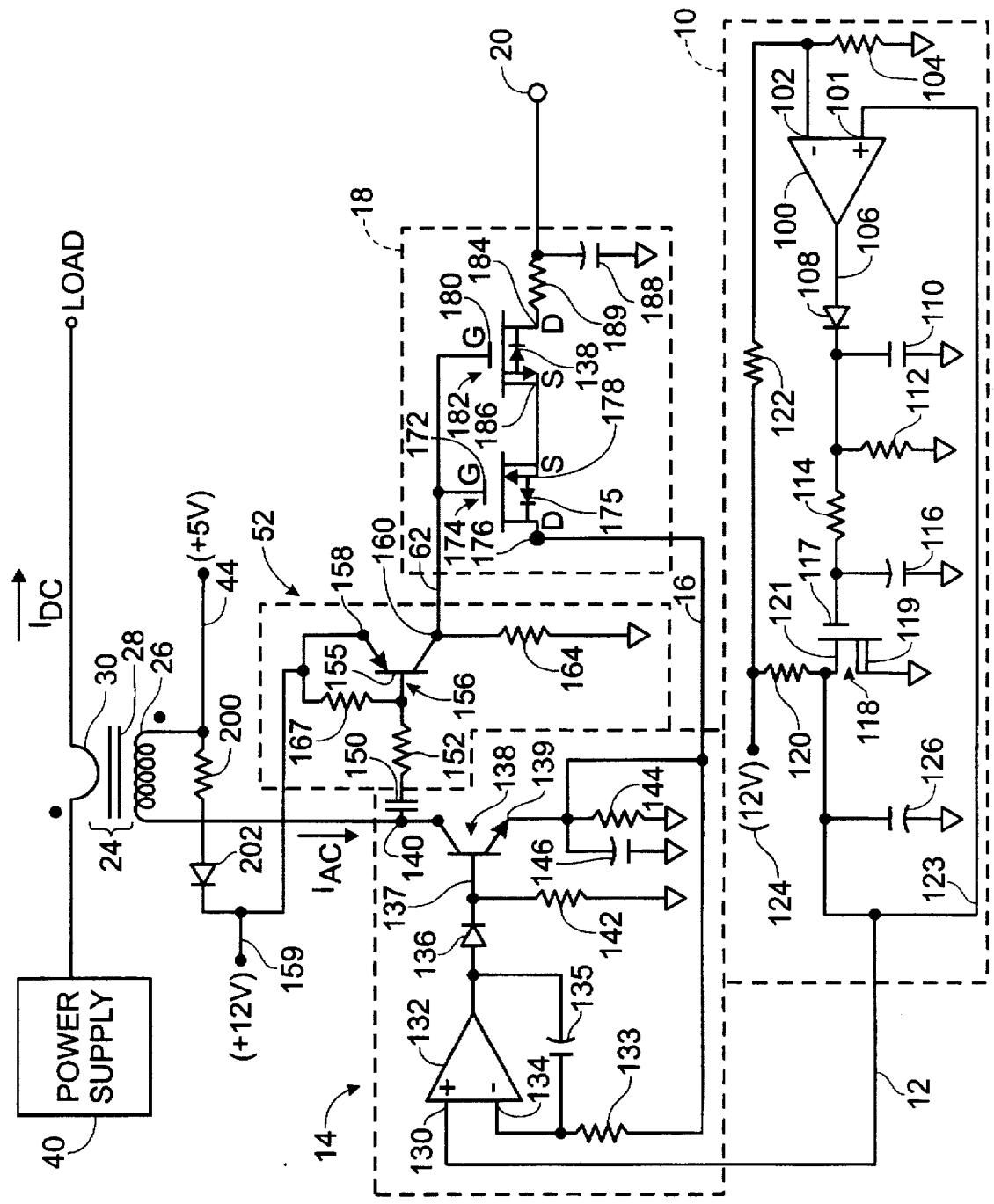
FIG. 3 is a schematic diagram of a preferred embodiment of the block diagram of FIG. 1.

FIG. 3 is a circuit schematic of the block diagram of FIG. 1. Referring now to FIG. 3, voltage ramp generator 10 of FIG. 1 comprises operational amplifier 100, FET 118 and the surrounding passive components which are set off by the dotted line indicated at reference numeral 10. Specifically, operational amplifier 100 has a negative input 102 connected though resistor 104 to ground and resistor 122 to bias voltage 124 which is preferably 12 volts. Output 106 of operational amplifier 100 is connected through diode 108 and resistor 114 to gate 117 of field effect transistor 118. Source 119 of FET 118 is connected to ground. Drain 121 of FET 118 is connected through resistor 120 to bias voltage 124. Capacitors 110 and resistor 112 are connected from the common point between diode 108 and resistor 114 in parallel to ground, and capacitor 116 is connected from the common point between resistor 114 and gate 117 of FET 118 to ground. Drain 121 of FET 118 is also connected via lead 124 to positive input 101 of operational amplifier 100. Capacitor 126 connects the drain of FET 118 to ground. Resistors 104 and 122 form a voltage divider for input 102 which along with bias voltage 124 sets a reference voltage that determines the maximum value of $V_{RG}$.

In operation, generally, charge is built up on capacitor 126 through resistor 120 until it reaches a value at which the voltage on input 101 exceeds the voltage on input 102 of operational amplifier 100. This is the peak value. At this point, output 106 of operational amplifier goes high thereby peak charging capacitor 110 and turning on FET 118. When FET 118 is turned on, it very quickly discharges capacitor 126 to ground. Some of the charge on capacitor 110 is transferred to capacitor 116. The remainder of charge on capacitor 110 is drained to ground through resistor 112. Resistor 114 and capacitor 116 form a time delay circuit which allows the peak charging of capacitor 110 before FET 118 turns on. The charge in capacitor 116 is also drained to ground through resistors 114 and 112. The time required to drain capacitors 110 and 116 to a voltage less than the 3 volts threshold of FET 118 is dead time 76. When capacitor 116 is discharged to a voltage level below the gate threshold of FET 118, FET 118 turns off and capacitor 126 commences to charge again. Diode 108 transfers the output of operational amplifier 100 onto capacitor 110. Diode 108 is required because the output of operational amplifier 100 only stays high for a short time interval. This is because as capacitor 126 discharges to the voltage level on input 102 of operational amplifier 100, the output of operational amplifier 100 goes low. This would prevent capacitor 126 from completely discharging and allows the dead time to be independently set by adjusting the values of capacitors 110 and 116 and resistor 112.

Voltage to current converter 14 of FIG. 1 comprises operational amplifier 132 and bi-polar NPN transistor 138 and the surrounding passive components which are set off by the dotted line indicated at reference numeral 14. Specifically, lead 12 connects the output of voltage ramp generator 10 at the common point between drain 121 of FET 118, resistor 120 and capacitor 126 to the input to voltage to current converter 14 at positive input 130 of operational amplifier 132. The output of operational amplifier 132 is connected in a feedback relationship through capacitor 135 to negative input 134 of operational amplifier 132.

The output of operational amplifier 132 is connected through diode 136 to base 137 of transistor 138. Resistor 142 is connected between base 137 of bi-polar NPN transistor 138 and ground. Emitter 139 of transistor 138 is connected to ground by the parallel combination of resistor 144 and capacitor 146.

In operation, generally, operational amplifier 132 supplies whatever voltage is necessary to base 137 of transistor 138 to make emitter 139 follow the ramp voltage on line 12. The voltage across resistor 144 produces a current in transistor 138 proportional to voltage on emitter 139. This is current, $I_{AC}$, which is pulled from voltage source 44 through primary winding 26 and through transistor 138 to be converted to a voltage drop across resistor 144. Thus, an ac current, $I_{AC}$, proportional to $V_{RG}$ is pulled through primary winding 26 in the opposite direction as the flow of current, $I_{DC}$. Resistor 142 ensures that transistor 138 turns off when there is no input voltage supplied by operational amplifier 132. This is done by pulling the voltage on base 137 of transistor 138 to ground when there is no voltage passing though diode 136. Diode 136 is required because the output of the operational amplifier 132 cannot go low enough to turn off transistor 138 totally. Thus, diode 136 provides an extra voltage drop. Capacitors 146 and 135 and resistor 133 are frequency compensation components for the inductance in $L_P$. They keep the circuit from oscillating.

In order to dissipate as small amount of power as possible in resistor 144 and transistor 138, voltage source 44 is chosen to be as low as possible, for example 5 volts. Also, dead time 76 is maximized to reduce the average current $I_{AC}$. The system limit on dead time 76 is dictated by the response needed to detect anticipated changes in the dc current to be measured. For most purposes, a sampling rate of between 10 and 100 samples per second would be suitable. In a preferred embodiment, 100 samples per second are taken.

Still referring to FIG. 3, one side of secondary winding 26 of transformer 24 is connected to voltage source 44, which is preferably 5 volts. The other end of winding 26 is connected through diode 202 to voltage supply 159. This clamps the maximum voltage on the collector of transistor 138. Resistor 200 is connected in parallel across both ends of winding 26 to help reset the core flux. The common point between winding 26, resistor 200 and diode 202, the output of transformer 24, is capacitively coupled through capacitor 150 to pulse generator 52 of FIG. 1

Relating FIG. 1 to FIG. 3, pulse generator 52 of FIG. 1 comprises bi-polar PNP transistor 156 and the surrounding passive components which are set off by the dotted line indicated at reference numeral 52 in FIG. 3. Specifically, collector 140 of transistor 138 is connected through capacitor 150 and resistor 152 to base 155 of PNP bi-polar transistor 156. Collector 160 of transistor 156 is connected through resistor 164 to ground. Emitter 158 is connected to power supply 159 which is preferably 12 volts dc. Base 155 is connected through resistor 162 to power supply 159, which is preferably 12 volts.

In operation, generally, the pulse generator circuit provides the timing signal to cause the transfer of the negative pulse 86 from inductor $L_P$ into sample and hold circuit 18 through transistor 156. Capacitor 150 isolates dc voltage source 44 from base 155 but couples voltage pulse 86 to base 155 of transistor 156. Resistors 152 and 162 set a threshold, $V_T$, for transistor 156. That is, when base 155 goes more than 0.6 volts below emitter 158, transistor 156 turns on, and voltage between collector 160 and emitter 158 drops is 0. This puts 12 volts from supply 159 on output 62. However, the output voltage from winding 26 required to bring base 55 of transistor 26 more than 0.6 volts below emitter 158 is determined by the ratio of resistors 152 and 162 and the value of supply voltage 159.

Referring to FIG. 2(c), $V_T$ determines the point in the negative voltage spike $V_{LP}$ when the sampling of the ac current will be done. It is set at a voltage level that is below the noise level and is preferably set at 1 volt.

Sample and hold circuit 18 of FIG. 1 comprises FETs 174 and 182 and the surrounding passive components which are set off by the dotted line indicated at reference numeral 18. The timing signal input to sample and hold circuit comes from collector 160 of transistor 156 in pulse generator 52. It is connected to gate 172 of FET 174 and to gate 180 of FET 182. Drain 176 of FET 174 is the other input to sample and hold circuit 18 and is connected to emitter 139 of transistor 138 by lead 16. It is also connected through resistor 133 to negative input 134 of operational amplifier 132. Source 178 of FET 174 is connected directly to source 186 of FET 182. Drain 184 of FET 182 is connected through capacitor 188 to ground and the common point between capacitor 188 and drain 184 is the output of the circuit.

In operation, generally, when the voltage on gates 172 and 180 is greater than the voltage on the sources 178 and 184, FETs 174 and 182 turn on. If the voltage is less, the FET's are off. Thus, when the voltage on collector 160 of transistor 156 is 0, FETs 184 and 182 are off. When the voltage on resistor 164 goes up to 12 volts which it does when transistor 156 turns on, then FETs 174 and 182 turn on. This then puts the voltage at emitter 139 of resistor 138 directly on capacitor 188. Two FETs are used because they are MOSFETs which have an internal diode in them as shown at reference numerals 175 and 183. Each of the internal diodes of MOSFETS 174 and 182 has its anode on the source and the cathode on the drain, as depicted in FIG. 3. FETs 174 and 182 are arranged such that diodes 175 and 183 are back to back so that current cannot flow through them unless both are turned on. FETs 174 and 182 isolate capacitor 188 from the voltage on emitter 139 for so long as they are not turned on. Alternatively a single junction FET could have been used.

Diode 202 clamps the maximum voltage present on collector 140 of transistor 138 to one diode drop above the voltage level set by voltage source 159 (e.g., 12 volts). Otherwise the voltage across transistor 138 from spike 86 could exceed the voltage breakdown on transistor 138.

Resistor 200 along with diode 202 resets transformer 24 by discharging the inductive field stored in $L_P$ during the dead time This resets the flux in winding 28 of transformer 24 to its initial state and ready for the next current ramp.

Since transformer 24 only comes out of saturation at or close to the moment that the flux from the two currents, $I_{AC}$ and $I_{DC}$ cancel each other, the duration of pulse 86 is very short, in the order of 2 milliseconds. Thus, the value of the voltage $V_{RG}$ can be accurately measured. This value is stored on capacitor 188 and updated with each cycle of $I_{AC}$. Also, the value of capacitor 188 is set to a value that gives the average of ramp voltage 70 during the time that sample and hold circuit 18 is turned on by pulse 92. This is accomplished by resistor 189.

A system has been described for measuring a large dc current from a power supply by use of a small ac current. The preferred embodiments just described are subject to numerous adaptations and modifications without departing from the concept of the invention. Therefore, within the scope of the appended claims, the invention may be practiced other than as specifically described herein.

What is claimed is:

1. An apparatus for measuring dc current in a power supply circuit, the apparatus comprising:
    a transformer having a primary winding, a core and a secondary winding, the secondary winding coupled to the power supply circuit, wherein the power supply circuit operative to supply dc current to the secondary winding to generate a second field of magnetic flux;
    a current generator, coupled to the primary winding of the transformer, to supply an ac current to the primary winding to generate a first field of magnetic flux;
    a pulse generator, coupled to the primary winding, to generate a pulse when the first field of magnetic flux is substantially equal to the second field of magnetic flux; and
    a measuring circuit, coupled to the current generator and responsive to the pulse generator, operative to measure the ac current in response to a pulse received from the pulse generator, at which time the measured ac current supplied by the current generator is proportional to the dc current.

2. The apparatus of claim 1, wherein the first field of magnetic flux is opposed to the second field of magnetic flux.

3. The apparatus of claim 1, wherein the current generator comprises:
    a ramp generator to generate a ramped voltage waveform; and
    a voltage-to-current converter, coupled to the ramp generator, which receives the ramped voltage waveform and generates an ac current corresponding to the ramped voltage waveform.

4. The apparatus of claim 3, wherein the ramped voltage waveform is characterized by a rise to a peak voltage value followed by a substantially instantaneous drop to a zero voltage level where the ramped voltage waveform remains until it once again begins to rise to the peak voltage value.

5. The apparatus of claim 4, wherein the ramped voltage waveform is characterized by a rise time of approximately four milliseconds to the peak voltage value, a dead time of approximately six milliseconds wherein the waveform is at substantially zero volts, and a period of approximately ten milliseconds.

6. The apparatus of claim 3, wherein the measuring circuit is comprised of a sample and hold circuit, coupled to the pulse generator and the ramp generator, wherein the sample and hold circuit stores a sample voltage of the ramped voltage waveform from the ramp generator.

7. The apparatus of claim 6, wherein the sample voltage is proportional to the ac current supplied by the current generator to the primary winding, and wherein the ac current is proportional to the dc current supplied to the secondary winding by the power supply when the pulse generator generates the pulse.

8. The apparatus of claim 1, wherein the pulse generator generates a pulse when the first field of magnetic flux is substantially equal to the second field of magnetic flux as manifested by a voltage potential of the primary winding dropping below a threshold voltage level.

9. The apparatus of claim 8, wherein the pulse lasts as long as the voltage potential of the primary winding is less than the threshold voltage level.

10. The apparatus of claim 1, wherein the core has a sufficiently high permeability so that the core is saturated by the second field of magnetic flux at less than five percent of a maximum dc current rating of the power supply.

11. The apparatus of claim 1, wherein the primary winding is comprised of more windings than the secondary winding.

12. The apparatus of claim 11, wherein the amount of ac current required to generate a first field of magnetic flux equivalent to the second field of magnetic flux is less than the dc current required to generate the second field of magnetic flux, wherein the ratio of ac current to dc current corresponds to the ratio of primary windings to secondary windings.

13. A method of measuring dc current in a power supply utilizing a transformer having a secondary winding coupled to an output of the power supply and a primary winding coupled to a current generator, the method comprising the steps of:
    generating a second field of magnetic flux on the secondary winding with the dc current from the power supply, wherein second field of magnetic flux is proportional to the dc current;
    supplying ac current to the primary winding from the current generator, wherein the ac current generates a first field of magnetic flux in the primary winding proportional to the ac current;
    generating a pulse when the first field of magnetic flux is substantially equivalent to the second field of magnetic flux; and
    determining the ac current supplied to the primary winding when a pulse is generated indicative that the first field of magnetic flux is substantially equivalent to the second field of magnetic flux, wherein the ac current is proportional to the dc current while the pulse is generated.

14. The method of claim 13, wherein the step of supplying ac current comprises generating a ramped voltage waveform with a ramp generator, and converting the ramped voltage waveform to a corresponding ac current with a voltage to current converter.

15. The method of claim 14, wherein the ramped voltage waveform is characterized with a rise to a peak voltage followed by a substantially simultaneous drop to a zero voltage level, wherein the ramped voltage waveform remains at the zero voltage level until it begins to rise to the peak voltage level.

16. The method of claim 15, wherein a voltage potential on the primary winding decreases in proportion to the rise in the ramped voltage waveform until the first field of magnetic flux substantially equals the second field of magnetic flux as manifested by the voltage potential on the primary winding dropping below a threshold voltage.

17. The method of claim 16, wherein the step of generating a pulse is performed when the voltage potential on the primary winding drops below the threshold voltage, indicative that the first field of magnetic flux is substantially equal to the second field of magnetic flux.

18. The method of claim 13, wherein the core of the transformer is characterized with a high permeability, wherein the core is saturated with the second field of magnetic flux when the power supply is supplying less than five percent of its maximum rated dc current.

19. The method of claim 13, wherein the transformer has a larger number of primary windings than secondary windings.

20. The method of claim 19, wherein the amount of ac current required to generate the first field of magnetic flux that is substantially equivalent to the second field of magnetic flux is less than the amount of dc current required to generate the second field of magnetic flux, wherein the ratio of ac current to dc current is proportional to the ratio of the primary windings to the secondary windings.

* * * * *